(12) United States Patent
Chou et al.

(10) Patent No.: US 12,402,347 B2
(45) Date of Patent: Aug. 26, 2025

(54) HIGH ELECTRON MOBILITY TRANSISTOR DEVICE AND MANUFACTURING METHOD THEREOF

(71) Applicant: Powerchip Semiconductor Manufacturing Corporation, Hsinchu (TW)

(72) Inventors: Jih-Wen Chou, Hsinchu (TW); Chih-Hung Lu, Taichung (TW); Bo-An Tsai, Hsinchu (TW); Zheng-Chang Mu, Hsinchu County (TW); Po-Hsien Yeh, Hsinchu County (TW); Robin Christine Hwang, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 468 days.

(21) Appl. No.: 17/975,559

(22) Filed: Oct. 27, 2022

(65) Prior Publication Data

US 2024/0079485 A1    Mar. 7, 2024

(30) Foreign Application Priority Data

Sep. 2, 2022   (TW) .................................. 111133309

(51) Int. Cl.
| | |
|---|---|
| *H10D 30/47* | (2025.01) |
| *H10D 30/01* | (2025.01) |
| *H10D 62/10* | (2025.01) |
| *H10D 62/85* | (2025.01) |

(52) U.S. Cl.
CPC ......... *H10D 30/475* (2025.01); *H10D 30/015* (2025.01); *H10D 30/47* (2025.01); *H10D 62/10* (2025.01); *H10D 62/102* (2025.01); *H10D 62/124* (2025.01); *H10D 62/8503* (2025.01)

(58) Field of Classification Search
CPC .... H10D 30/475; H10D 30/015; H10D 30/47; H10D 62/8503; H10D 62/10; H10D 62/124; H10D 62/102
See application file for complete search history.

(56) References Cited

U.S. PATENT DOCUMENTS

| | | | |
|---|---|---|---|
| 7,692,263 B2 | 4/2010 | Wu et al. | |
| 7,960,756 B2 | 6/2011 | Sheppard et al. | |
| 8,404,508 B2 | 3/2013 | Lidow et al. | |
| 8,592,868 B2 | 11/2013 | Heikman et al. | |
| 8,648,390 B2 | 2/2014 | Kub et al. | |

(Continued)

FOREIGN PATENT DOCUMENTS

| | | | | |
|---|---|---|---|---|
| CN | 110061053 B | * | 7/2024 | ......... H01L 29/0603 |
| EP | 2479790 | | 7/2012 | |

(Continued)

*Primary Examiner* — Joseph C. Nicely
(74) *Attorney, Agent, or Firm* — JCIPRNET

(57) ABSTRACT

A high electron mobility transistor device including a channel layer, a first barrier layer, and a P-type gallium nitride layer is provided. The first barrier layer is disposed on the channel layer. The P-type gallium nitride layer is disposed on the first barrier layer. The first thickness of the first barrier layer located directly under the P-type gallium nitride layer is greater than the second thickness of the first barrier layer located on two sides of the P-type gallium nitride layer.

14 Claims, 11 Drawing Sheets

(56) References Cited

U.S. PATENT DOCUMENTS

| | | | | |
|---|---|---|---|---|
| 8,901,654 | B1* | 12/2014 | Dornel | H10D 30/0323 |
| | | | | 438/300 |
| 9,748,347 | B2* | 8/2017 | Cao | H10D 62/343 |
| 2006/0108606 | A1 | 5/2006 | Saxler et al. | |
| 2010/0258843 | A1* | 10/2010 | Lidow | H10D 30/475 |
| | | | | 257/E21.403 |
| 2013/0299882 | A1* | 11/2013 | Disney | H10D 64/411 |
| | | | | 257/E29.313 |
| 2016/0020283 | A1* | 1/2016 | Bayram | H10D 62/115 |
| | | | | 438/479 |
| 2020/0350399 | A1* | 11/2020 | Wong | H10D 62/343 |
| 2021/0175343 | A1* | 6/2021 | Chen | H10D 30/4732 |
| 2021/0242337 | A1* | 8/2021 | Wang | H10D 62/824 |
| 2021/0376135 | A1* | 12/2021 | Kwan | H10D 84/05 |
| 2023/0299169 | A1* | 9/2023 | Chou | H10D 30/675 |
| | | | | 257/76 |
| 2023/0395694 | A1* | 12/2023 | Chern | H10D 64/513 |

FOREIGN PATENT DOCUMENTS

| | | | |
|---|---|---|---|
| KR | 102191924 B1 | * | 12/2020 |
| TW | 202042393 | | 11/2020 |
| TW | 202131517 | | 8/2021 |
| TW | I774107 | | 8/2022 |

* cited by examiner

HIGH ELECTRON MOBILITY TRANSISTOR DEVICE AND MANUFACTURING METHOD THEREOF

CROSS-REFERENCE TO RELATED APPLICATION

This application claims the priority benefit of Taiwan application serial no. 111133309, filed on Sep. 2, 2022. The entirety of the above-mentioned patent application is hereby incorporated by reference herein and made a part of this specification.

BACKGROUND

Technical Field

The invention relates to a semiconductor device and a manufacturing method thereof, and particularly relates to a high electron mobility transistor (HEMT) device and a manufacturing method thereof.

Description of Related Art

The HEMT is a field effect transistor and can have high breakdown voltage and high reliability. However, a large electric field is often generated at the gate edge of the HEMT, which increases the leakage current of the HEMT, thereby reducing the reliability of the HEMT.

SUMMARY

The invention provides a HEMT device and a manufacturing method thereof, which can improve the reliability of the HEMT device.

The invention provides a HEMT device, which includes a channel layer, a first barrier layer, and a P-type gallium nitride (P-type GaN) layer. The first barrier layer is disposed on the channel layer. The P-type gallium nitride layer is disposed on the first barrier layer. The first thickness of the first barrier layer located directly under the P-type gallium nitride layer is greater than the second thickness of the first barrier layer located on two sides of the P-type gallium nitride layer.

According to an embodiment of the invention, in the HEMT device, the first thickness may be 14 nm (nanometer) to 24 nm.

According to an embodiment of the invention, in the HEMT device, the second thickness may be 2 nm to 22 nm.

According to an embodiment of the invention, in the HEMT device, the first upper surface of the first barrier layer located directly under the P-type gallium nitride layer may be higher than the second upper surface of the first barrier layer located on two sides of the P-type gallium nitride layer.

According to an embodiment of the invention, in the HEMT device, the material of the first barrier layer is, for example, aluminum gallium nitride (AlGaN).

According to an embodiment of the invention, in the HEMT device, the aluminum content in the aluminum gallium nitride may be 5 atomic % to 50 atomic %.

According to an embodiment of the invention, the HEMT device may further include a second barrier layer. The second barrier layer is disposed on the first barrier layer. The second barrier layer and the P-type gallium nitride layer may be separated from each other.

According to an embodiment of the invention, in the HEMT device, the material of the second barrier layer is, for example, aluminum gallium nitride.

According to an embodiment of the invention, in the HEMT device, the aluminum content in the aluminum gallium nitride may be 5 atomic % to 50 atomic %.

According to an embodiment of the invention, the HEMT device may further include a spacer. The spacer is disposed on the sidewall of the P-type gallium nitride layer and on the first barrier layer. The spacer may be located between the second barrier layer and the P-type gallium nitride layer.

According to an embodiment of the invention, in the HEMT device, the width of the spacer may be 0.1 μm (micrometer) to 0.5 μm.

According to an embodiment of the invention, the HEMT device may further include a passivation layer. The passivation layer is disposed on the P-type gallium nitride layer, the spacer, and the second barrier layer.

According to an embodiment of the invention, the HEMT device may further include a work function layer. The work function layer is disposed on the P-type gallium nitride layer.

According to an embodiment of the invention, in the HEMT device, the width of the work function layer may be smaller than the width of the P-type gallium nitride layer.

The invention provides a manufacturing method of a HEMT device, which includes the following steps. A channel layer is provided. A first barrier layer is formed on the channel layer. A P-type gallium nitride layer is formed on the first barrier layer. The first thickness of the first barrier layer located directly under the P-type gallium nitride layer is greater than the second thickness of the first barrier layer located on two sides of the P-type gallium nitride layer.

According to an embodiment of the invention, the manufacturing method of the HEMT device may further include the following step. A second barrier layer is formed on the first barrier layer. The second barrier layer and the P-type gallium nitride layer may be separated from each other.

According to an embodiment of the invention, the manufacturing method of the HEMT device may further include the following step. A spacer is formed on the sidewall of the P-type gallium nitride layer and on the first barrier layer. The spacer may be located between the second barrier layer and the P-type gallium nitride layer.

According to an embodiment of the invention, the manufacturing method of the HEMT device may further include the following step. A passivation layer is formed on the P-type gallium nitride layer, the spacer, and the second barrier layer.

According to an embodiment of the invention, the manufacturing method of the HEMT device may further include the following step. A work function layer is formed on the P-type gallium nitride layer.

According to an embodiment of the invention, the manufacturing method of the HEMT device may further include the following step. A lateral etching process is performed on the work function layer to reduce the width of the work function layer.

Based on the above description, in the HEMT device and the manufacturing method thereof according to the invention, the first thickness of the first barrier layer located directly under the P-type gallium nitride layer is greater than the second thickness of the first barrier layer located on two sides of the P-type gallium nitride layer. Therefore, the concentration of two-dimensional electron gas (2DEG) at the edge of the P-type gallium nitride layer can be reduced, thereby reducing the leakage current of the HEMT device and improving the reliability of the HEMT device.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1K are cross-sectional views illustrating a manufacturing process of a HEMT device according to some embodiments of the invention.

Figure 1A:
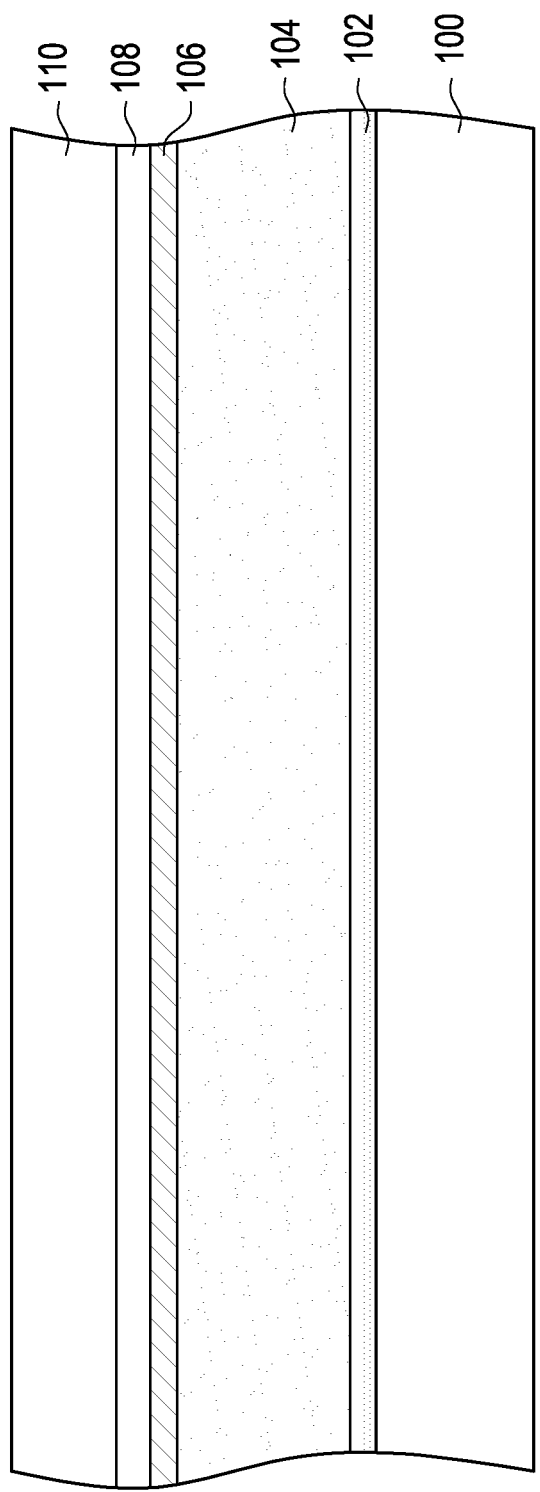
FIG. 1A to FIG. 1K are cross-sectional views illustrating a manufacturing process of a HEMT device according to some embodiments of the invention.

Referring to FIG. 1A, a channel layer 100 is provided. In some embodiments, the channel layer 100 may be provided on a substrate (not shown). The substrate may be a semiconductor substrate such as a silicon substrate. In some embodiments, there may be a buffer layer (not shown) between the channel layer 100 and the substrate. The material of the buffer layer is, for example, aluminum nitride, aluminum gallium nitride, carbon-doped gallium nitride (C-doped GaN), or a combination thereof. The material of the channel layer 100 is, for example, gallium nitride. The method of forming the channel layer 100 is, for example, an epitaxial growth method.

A barrier layer 102 is formed on the channel layer 100. The material of the barrier layer 102 is, for example, aluminum gallium nitride. The method of forming the barrier layer 102 is, for example, an epitaxial growth method.

A P-type gallium nitride material layer 104 may be formed on the barrier layer 102. The method of forming the P-type gallium nitride material layer 104 is, for example, an epitaxial growth method.

A work function material layer 106 may be formed on the P-type gallium nitride material layer 104. In addition, when the interface between the work function material layer 106 and the P-type gallium nitride material layer 104 forms an ohmic contact, the material of the work function material layer 106 may be tantalum (Ta), aluminum (Al), or titanium (Ti). In addition, when the interface between the work function material layer 106 and the P-type gallium nitride material layer 104 forms a Schottky contact, the material of the work function material layer 106 may be titanium nitride (TiN), tantalum nitride (TaN), tungsten (W), nickel (Ni), or gold (Au). The method of forming the work function material layer 106 is, for example, an atomic layer deposition (ALD) method or a physical vapor deposition (PVD) method.

A hard mask material layer 108 may be formed on the work function material layer 106. The material of the hard mask material layer 108 is, for example, silicon oxide. The method of forming the hard mask material layer 108 is, for example, a chemical vapor deposition (CVD) method.

A hard mask material layer 110 may be formed on hard mask material layer 108. The material of the hard mask material layer 110 is, for example, silicon nitride. The method of forming the hard mask material layer 110 is, for example, a CVD method.

Figure 1B:
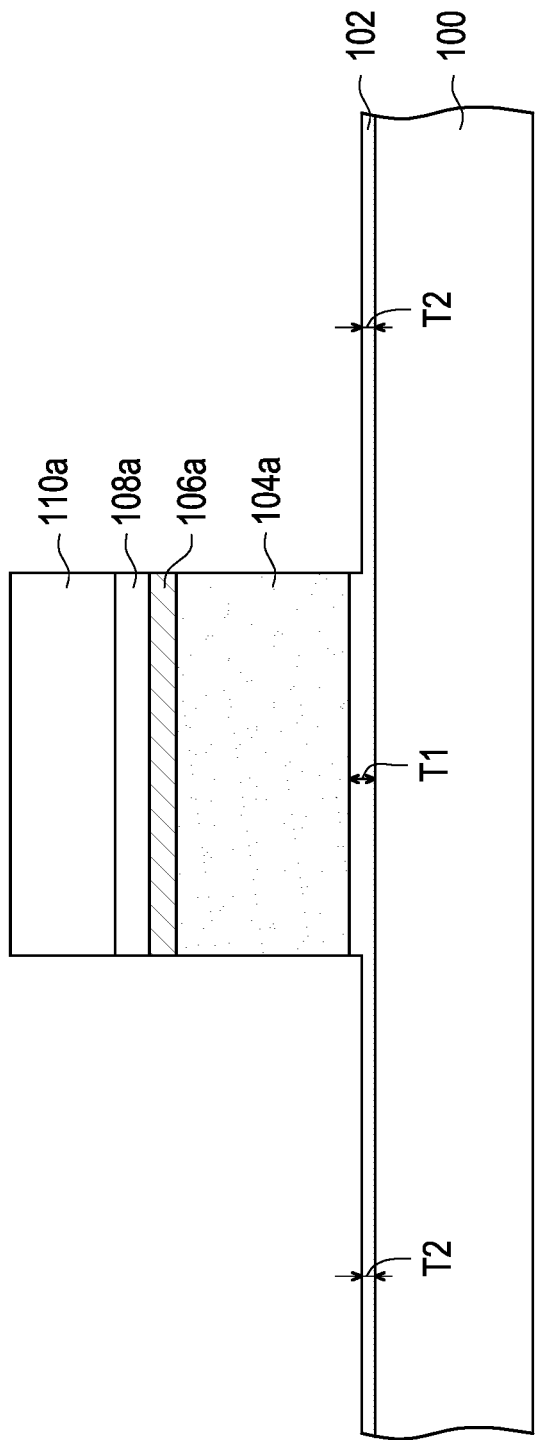

Referring to FIG. 1B, the hard mask material layer 110, the hard mask material layer 108, the work function material layer 106, and the P-type gallium nitride material layer 104 may be patterned to form a hard mask layer 110a, a hard mask layer 108a, a work function layer 106a, and a P-type gallium nitride layer 104a. Therefore, the P-type gallium nitride layer 104a may be formed on the barrier layer 102, the work function layer 106a may be formed on the P-type gallium nitride layer 104a, the hard mask layer 108a may be formed on the work function layer 106a, and the hard mask layer 110a may be formed on the hard mask layer 108a. In some embodiments, the hard mask material layer 110, the hard mask material layer 108, the work function material layer 106, and the P-type gallium nitride material layer 104 may be patterned by a lithography process and an etching process (e.g., dry etching process). Furthermore, a portion of the barrier layer 102 may be removed. Therefore, the thickness T1 of the barrier layer 102 located directly under the P-type gallium nitride layer 104a is greater than the thickness T2 of the barrier layer 102 located on two sides of the P-type gallium nitride layer 104a. In some embodiments, the portion of barrier layer 102 may be removed during patterning the hard mask material layer 110, the hard mask material layer 108, the work function material layer 106, and the P-type gallium nitride material layer 104.

Figure 1C:
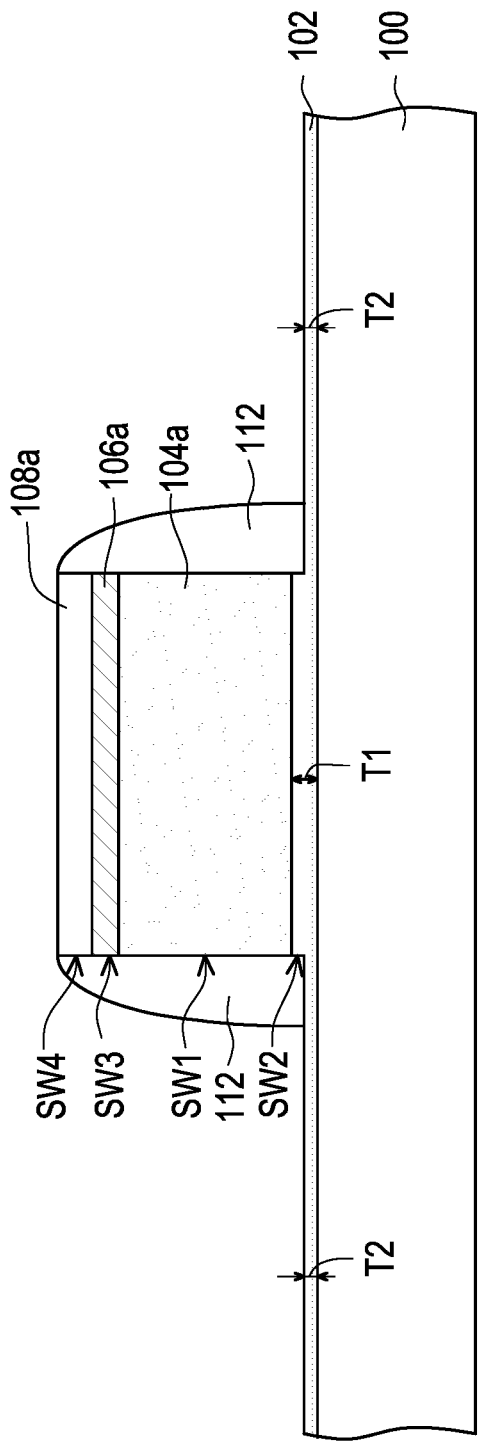

Referring to FIG. 1C, the hard mask layer 110a may be removed. The method of removing the hard mask layer 110a is, for example, a wet etching method.

A spacer 112 may be formed on the sidewall SW1 of the P-type gallium nitride layer 104a and on the barrier layer 102. In addition, the spacer 112 may be further formed on the sidewall SW2 of the barrier layer 102, the sidewall SW3 of the work function layer 106a, and the sidewall SW4 of the hard mask layer 108a. The spacer 112 may be a single-layer structure or a multilayer structure. The material of the spacer 112 is, for example, silicon oxide, silicon nitride, or a combination thereof. In some embodiments, the method of forming the spacer 112 may include the following steps, but the invention is not limited thereto. A spacer material layer (not shown) may be conformally formed on the barrier layer 102, the P-type gallium nitride layer 104a, the work function layer 106a, and the hard mask layer 108a. A dry etching process may be performed on the spacer material layer to form the spacer 112.

Figure 1D:
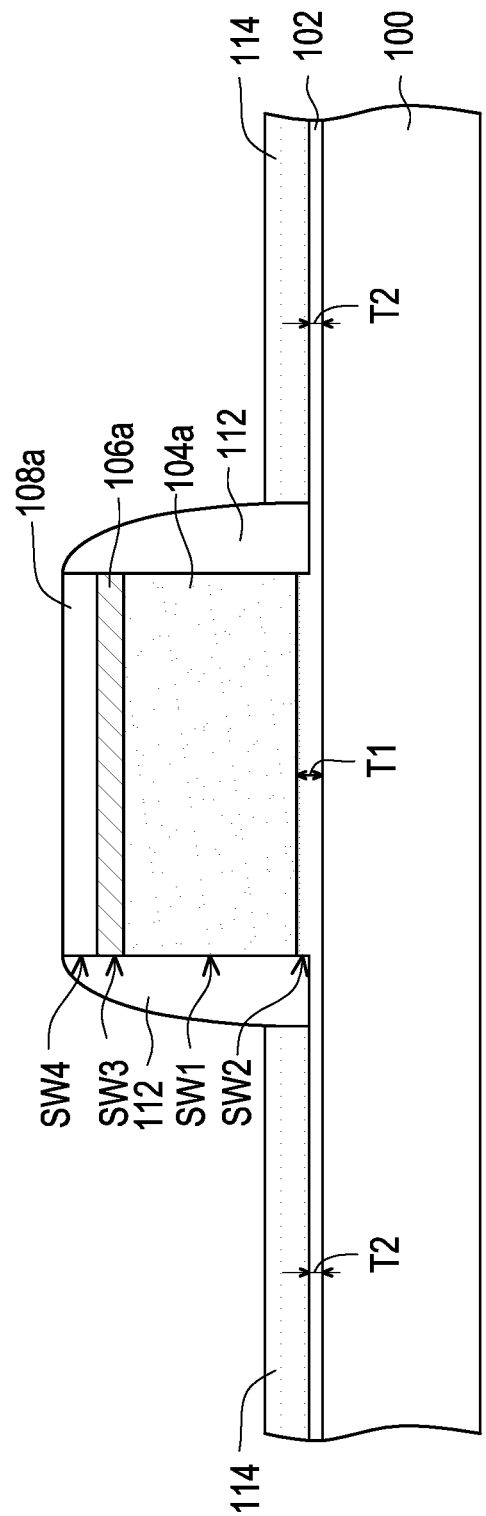

Referring to FIG. 1D, a barrier layer 114 may be formed on the barrier layer 102. The barrier layer 114 and the P-type gallium nitride layer 104a may be separated from each other. In addition, the spacer 112 may be located between the barrier layer 114 and the P-type gallium nitride layer 104a. In some embodiments, the method of forming the barrier layer 114 is, for example, an epitaxial growth method. In some embodiments, the method of forming the barrier layer 114 is, for example, a metal-organic chemical vapor deposition (MOCVD) method.

Figure 1E:
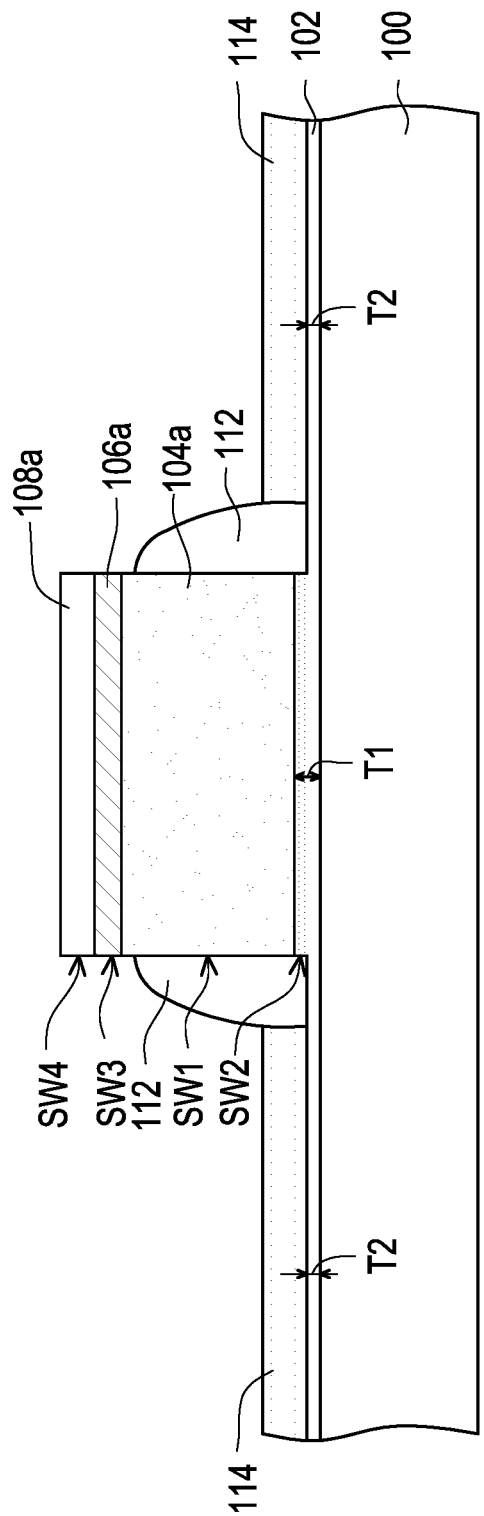

Referring to FIG. 1E, the height of the spacer 112 may be reduced, thereby exposing the sidewall SW3 of the work function layer 106a and the sidewall SW4 of the hard mask layer 108a. The method of reducing the height of the spacer 112 is, for example, a dry etching method.

Figure 1F:
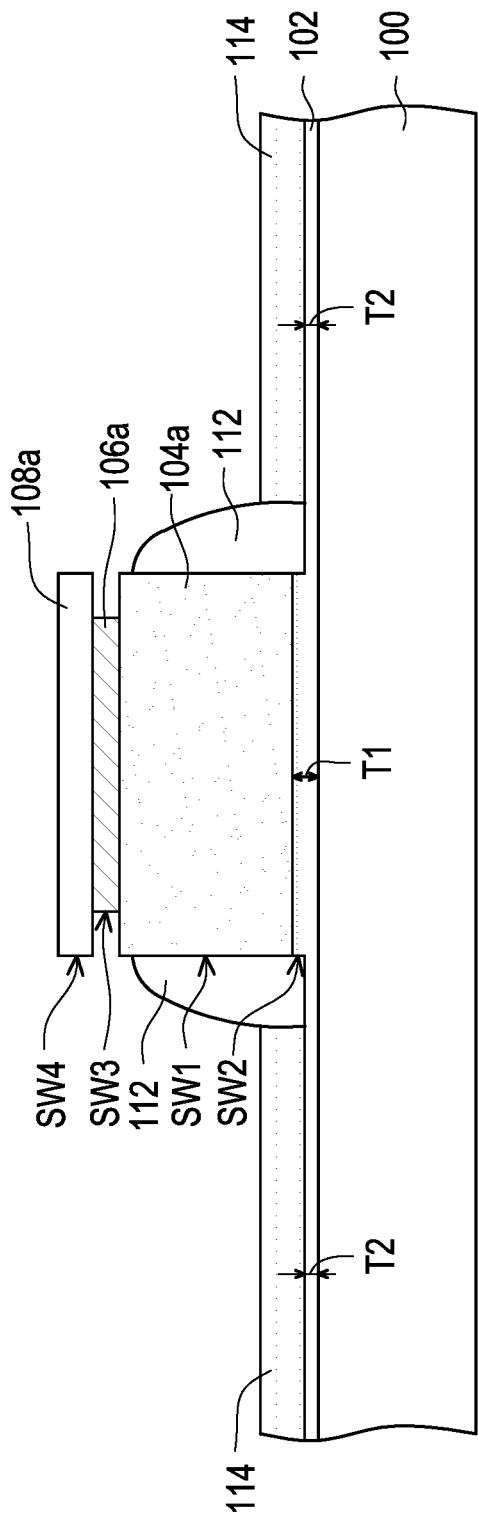

Referring to FIG. 1F, a lateral etching process may be performed on the work function layer 106a to reduce the width of the work function layer 106a. Therefore, the sidewall SW3 of the work function layer 106a may not be aligned with the sidewall SW1 of the P-type gallium nitride layer 104a. The lateral etching process is, for example, a dry etching process.

Figure 1G:
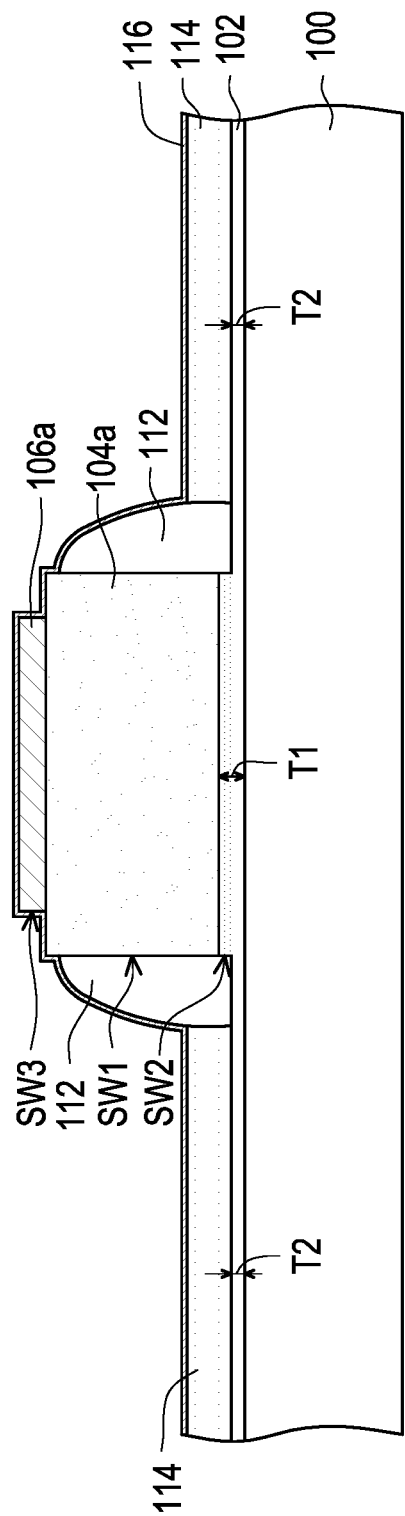

Referring to FIG. 1G, the hard mask layer 108a may be removed. The method of removing the hard mask layer 108a is, for example, a dry etching method. In some embodiments, after removing the hard mask layer 108a, a pre-clean process may be performed.

A passivation layer 116 may be formed on the P-type gallium nitride layer 104a, the spacer 112, the barrier layer 114, and the work function layer 106a. The material of the passivation layer 116 is, for example, aluminum oxide or aluminum nitride. The method of forming the passivation layer 116 is, for example, an ALD method.

Figure 1H:
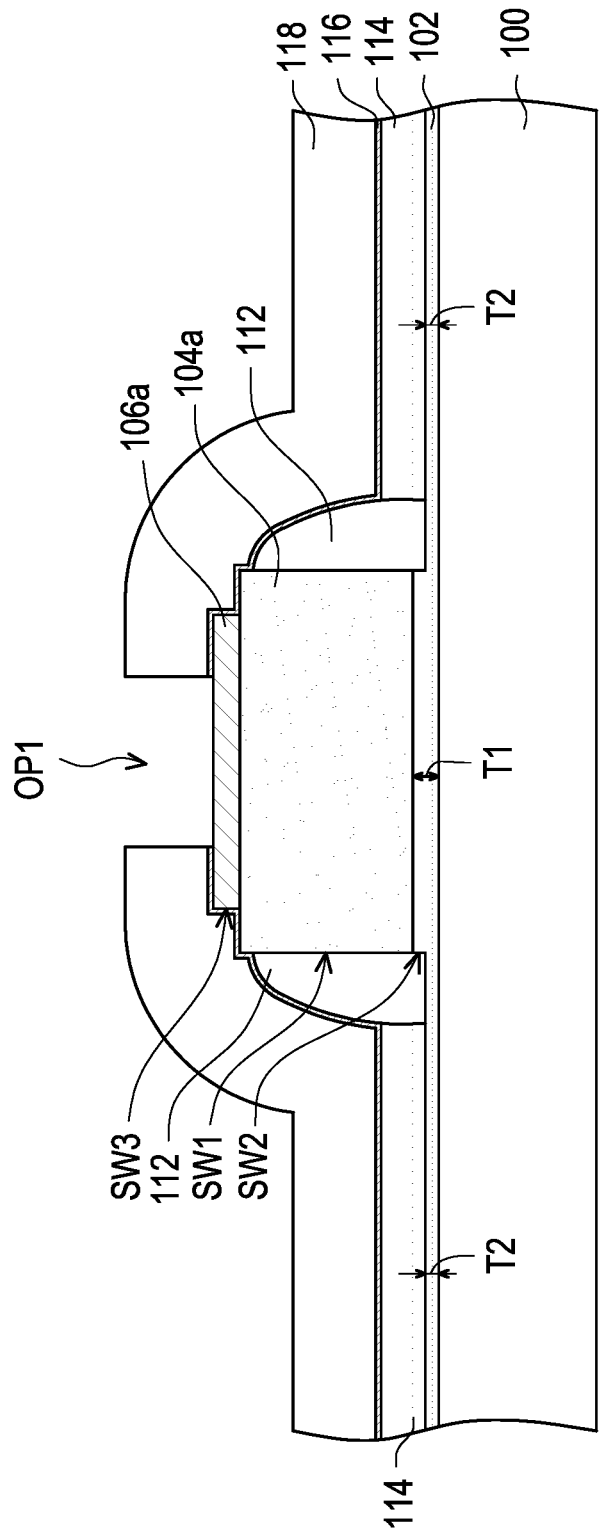

Referring to FIG. 1H, a dielectric layer 118 may be formed on the passivation layer 116. The material of the dielectric layer 118 is, for example, silicon oxide. The method of forming the dielectric layer 118 is, for example, a CVD method.

An opening OP1 may be formed in the dielectric layer 118 and the passivation layer 116. The opening OP1 may expose the work function layer 106a. In some embodiments, the opening OP1 may be formed by removing a portion of the dielectric layer 118 and a portion of the passivation layer 116 by a lithography process and an etching process (e.g., dry etching process).

Figure 1I:
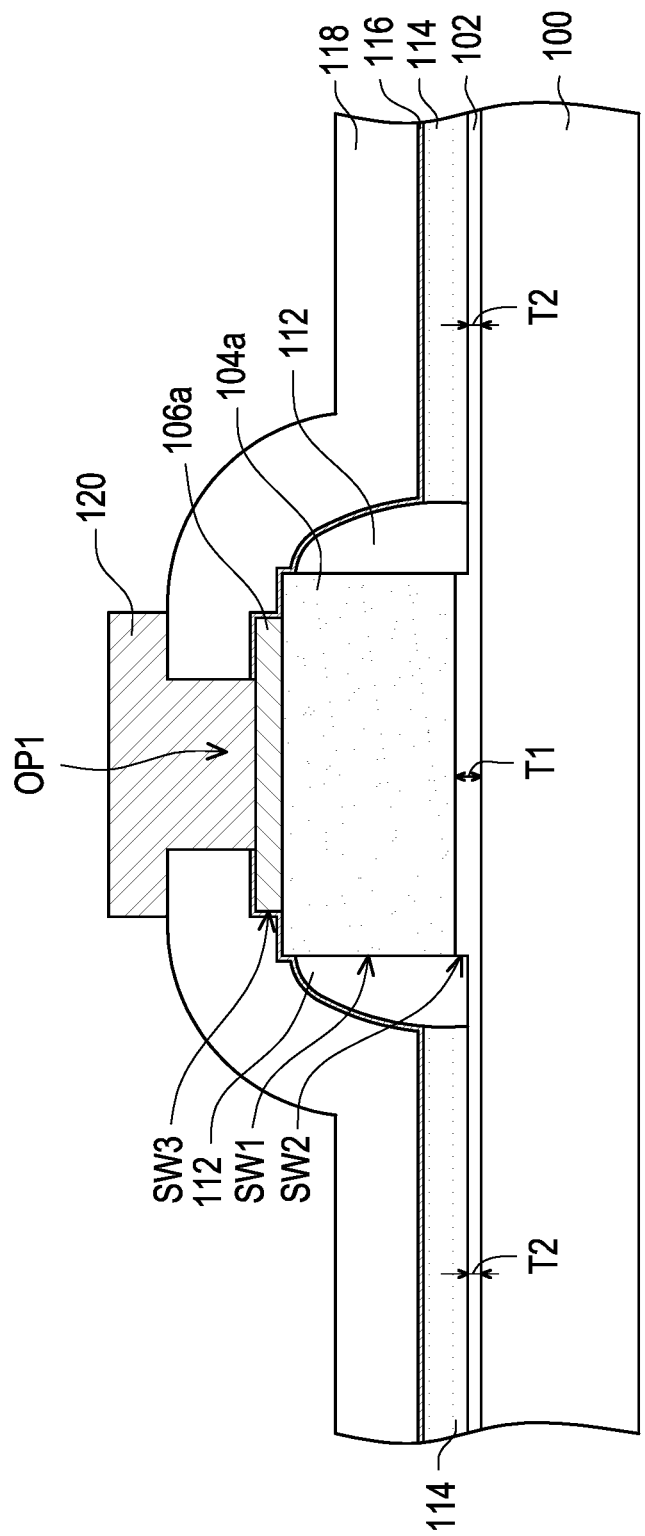

Referring to FIG. 1I, a contact 120 may be formed in the opening OP1. The contact 120 may be electrically connected to the P-type gallium nitride layer 104a. In some embodiments, the contact 120 may be electrically connected to the work function layer 106a, and the contact 120 may be electrically connected to the P-type gallium nitride layer 104a by the work function layer 106a. The material of the contact 120 is, for example, titanium, titanium nitride, aluminum copper alloy (AlCu), or a combination thereof. In some embodiments, the contact 120 may be formed by a deposition process, a lithography process, and an etching process.

Figure 1J:
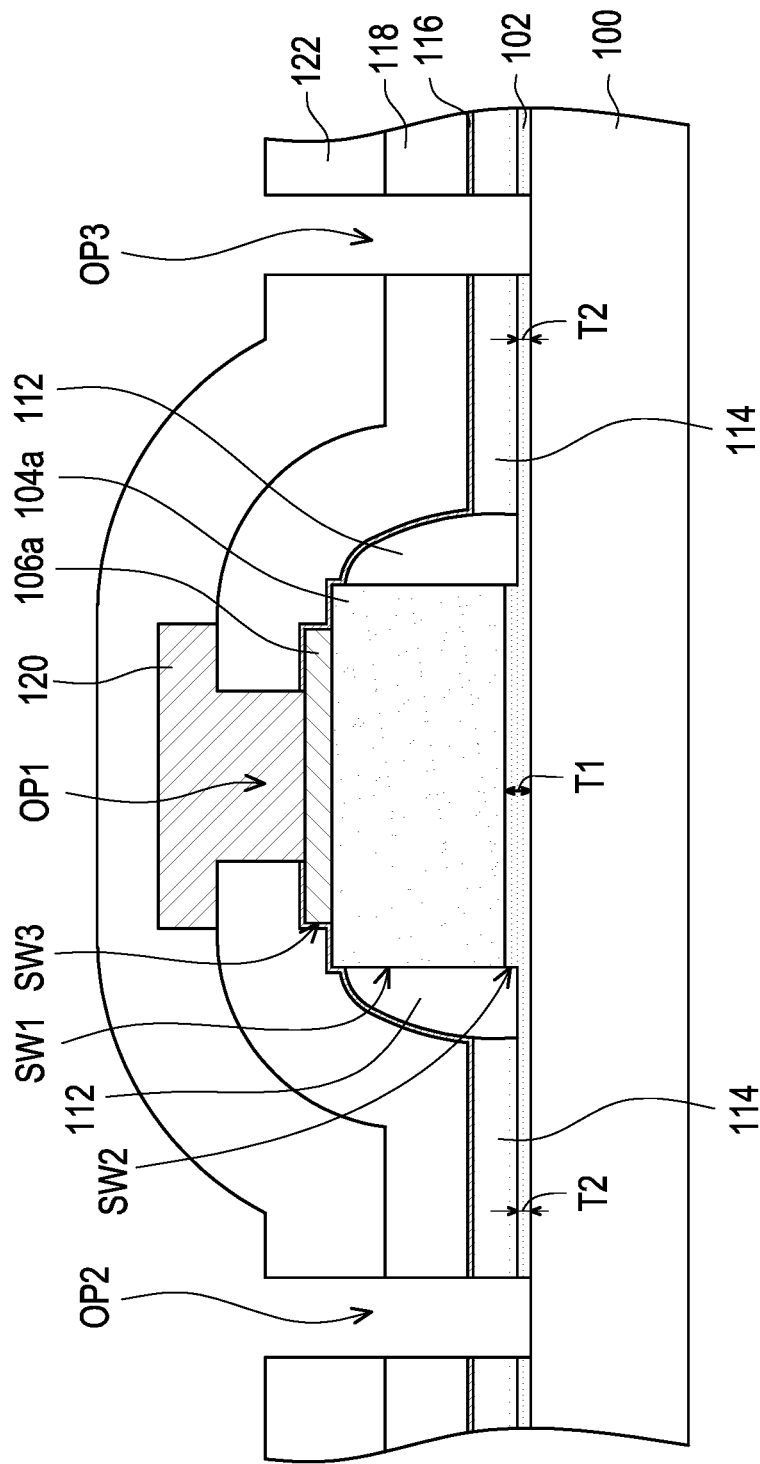

Referring to FIG. 1J, a dielectric layer 122 may be formed on the dielectric layer 118 and the contact 120. The material of the dielectric layer 122 is, for example, silicon oxide. The method of forming the dielectric layer 122 is, for example, a CVD method.

An opening OP2 and an opening OP3 may be formed in the dielectric layer 122, the dielectric layer 118, the passivation layer 116, the barrier layer 114, and the barrier layer 102. The opening OP2 and the opening OP3 may respectively expose a portion of the channel layer 100. In some embodiments, the opening OP2 and the opening OP3 may be formed by removing a portion of the dielectric layer 122, a portion of the dielectric layer 118, a portion of the passivation layer 116, a portion of the barrier layer 114, and a portion of the barrier layer 102 by a lithography process and an etching process (e.g., dry etching process).

Figure 1K:
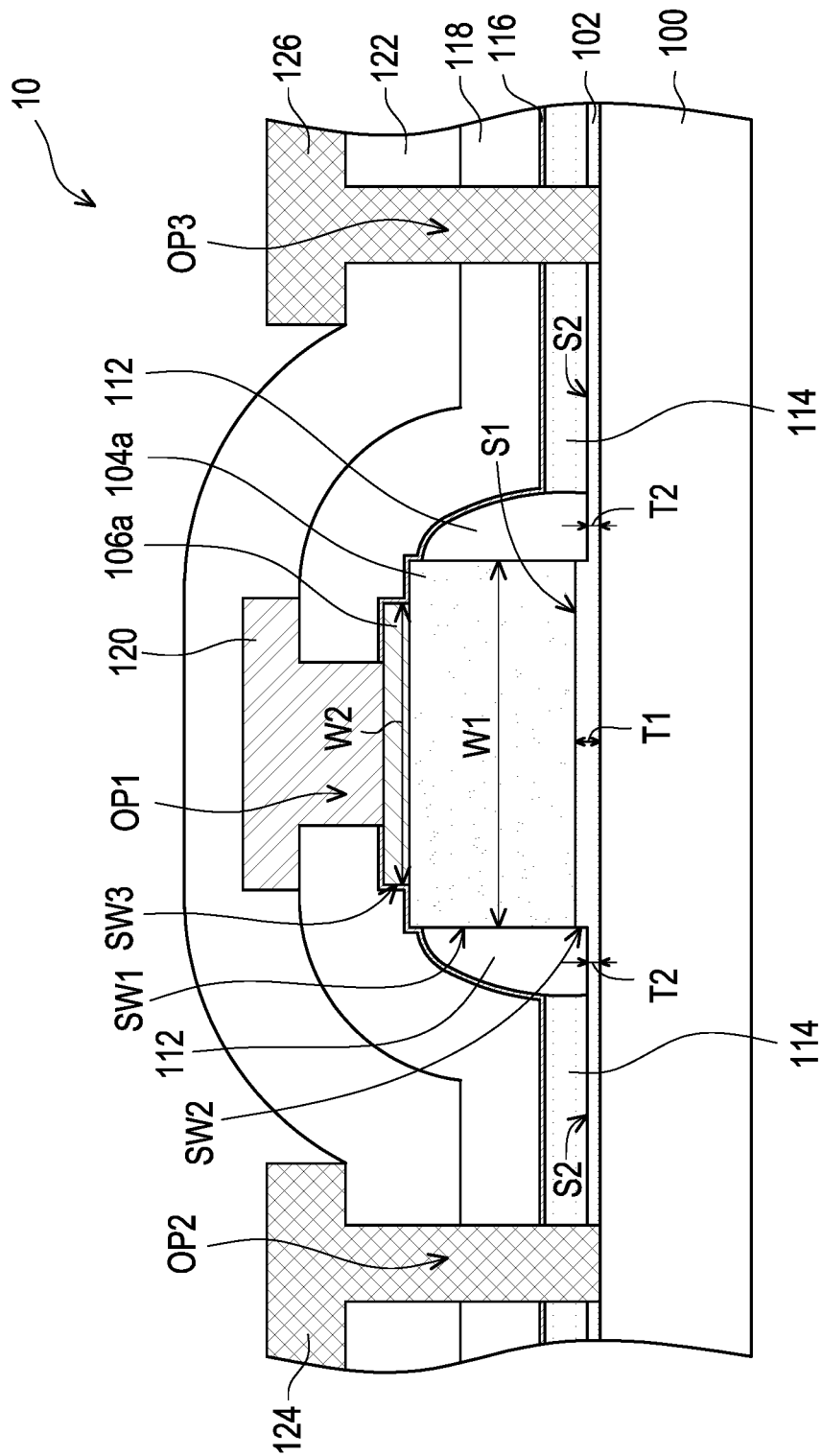

Referring to FIG. 1K, a source electrode 124 and a drain electrode 126 may be formed in the opening OP2 and the opening OP3, respectively. The material of the source electrode 124 and the drain electrode 126 is, for example, titanium, titanium nitride, aluminum copper alloy, or a combination thereof. In some embodiments, the source electrode 124 and the drain electrode 126 may be formed by a deposition process, a lithography process, and an etching process.

Hereinafter, the HEMT device 10 of the above embodiment is described with reference to FIG. 1K. Moreover, although the method for forming the HEMT device 10 is described by taking the above method as an example, the invention is not limited thereto.

Referring to FIG. 1K, the HEMT device 10 includes a channel layer 100, a barrier layer 102, and a P-type gallium nitride layer 104a. The material of the channel layer 100 is, for example, gallium nitride.

The barrier layer 102 is disposed on the channel layer 100. The material of the barrier layer 102 is, for example, aluminum gallium nitride. In some embodiments, the aluminum content in the aluminum gallium nitride may be 5 atomic % to 50 atomic %. The aluminum content in the aluminum gallium nitride can be used to adjust the concentration of the 2DEG. In some embodiments, when the material of the barrier layer 102 is aluminum gallium nitride, and the aluminum content in the aluminum gallium nitride is 5 atomic % to 50 atomic %, the concentration of the 2DEG of the HEMT device 10 can be increased, thereby improving the on-current ($I_{on}$) and the electrical performance of the HEMT device 10.

The P-type gallium nitride layer 104a is disposed on the barrier layer 102. The P-type gallium nitride layer 104a may be used as a gate. In some embodiments, the thickness of the P-type gallium nitride layer 104a may be 80 nm to 100 nm.

In addition, the thickness T1 of the barrier layer 102 located directly under the P-type gallium nitride layer 104a is greater than the thickness T2 of the barrier layer 102 located on two sides of the P-type gallium nitride layer 104a. Therefore, the concentration of the 2DEG at the edge of the P-type gallium nitride layer 104a can be reduced, thereby reducing the leakage current of the HEMT device 10 and improving the reliability of the HEMT device 10. In some embodiments, the thickness T1 of the barrier layer 102 may be 14 nm to 24 nm, and the thickness T2 of the barrier layer 102 may be 2 nm to 22 nm. In addition, the upper surface S1 of the barrier layer 102 located directly under the P-type gallium nitride layer 104a may be higher than the upper surface S2 of the barrier layer 102 located on two sides of the P-type gallium nitride layer 104a.

The HEMT device 10 may further include at least one of a work function layer 106a, a spacer 112, a barrier layer 114, a passivation layer 116, a dielectric layer 118, a contact 120, a dielectric layer 122, a source electrode 124, and a drain electrode 126. The work function layer 106a is disposed on the P-type gallium nitride layer 104a. In some embodiments, the width W2 of the work function layer 106a may be smaller than the width W1 of the P-type gallium nitride layer 104a, thereby reducing leakage paths. In some embodiments, the sidewall SW3 of the work function layer 106a may not be aligned with the sidewall SW1 of the P-type gallium nitride layer 104a. In addition, when the interface between the work function layer 106a and the P-type gallium nitride layer 104a forms an ohmic contact, the material of the work function layer 106a may be tantalum (Ta), aluminum (Al), or titanium (Ti). Furthermore, when the interface between the work function layer 106a and the P-type gallium nitride layer 104a forms a Schottky contact, the material of the work function layer 106a may be titanium nitride (TiN), tantalum nitride (TaN), tungsten (W), nickel (Ni), or gold (Au). In some embodiments, the thickness of the work function layer 106a may be 30 nm to 50 nm.

The spacer 112 is disposed on the sidewall SW1 of the P-type gallium nitride layer 104a and on the barrier layer 102. In some embodiments, the spacer 112 may be further disposed on the sidewall SW2 of the barrier layer 102. The spacer 112 may be a single-layer structure or a multilayer structure. The material of the spacer 112 is, for example, silicon oxide, silicon nitride, or a combination thereof. In some embodiments, the width of the spacer 112 may be 0.1 μm to 0.5 μm.

The barrier layer 114 is disposed on the barrier layer 102. The barrier layer 114 and the P-type gallium nitride layer 104a may be separated from each other. The spacer 112 may be located between the barrier layer 114 and the P-type gallium nitride layer 104a. The barrier layer 114 can increase the concentration of the 2DEG under the barrier layer 114, thereby improving the on-current ($I_{on}$) and the electrical performance of the HEMT device 10. The material of the barrier layer 114 is, for example, aluminum gallium nitride. In some embodiments, the aluminum content in the aluminum gallium nitride may be 5 atomic % to 50 atomic %. The aluminum content in the aluminum gallium nitride can be used to adjust the concentration of the 2DEG. In some embodiments, when the material of the barrier layer 114 is aluminum gallium nitride, and the aluminum content in the aluminum gallium nitride is 5 atomic % to 50 atomic %, the concentration of the 2DEG of the HEMT device 10 can be increased, thereby improving the on-current ($I_{on}$) and the electrical performance of the HEMT device 10. In some embodiments, the thickness of the barrier layer 114 may be 5 nm to 20 nm.

The passivation layer 116 is disposed on the P-type gallium nitride layer 104a, the spacer 112, the barrier layer 114, and the work function layer 106a. The passivation layer 116 can be used to block moisture. The material of the passivation layer 116 is, for example, aluminum oxide or aluminum nitride.

The dielectric layer 118 is disposed on the passivation layer 116. The material of the dielectric layer 118 is, for example, silicon oxide. The contact 120 is electrically connected to the P-type gallium nitride layer 104a. In some embodiments, the contact 120 may be electrically connected to the work function layer 106a, and the contact 120 may be electrically connected to the P-type gallium nitride layer 104a by the work function layer 106a. In some embodiments, the contact 120 may pass through the dielectric layer 118 and the passivation layer 116 to be electrically connected to the work function layer 106a. In some embodiments, a portion of the contact 120 may be disposed on the dielectric layer 118. The material of the contact 120 is, for example, titanium, titanium nitride, aluminum copper alloy, or a combination thereof.

The dielectric layer 122 is disposed on the dielectric layer 118 and the contact 120. The material of the dielectric layer 122 is, for example, silicon oxide. The source electrode 124 and the drain electrode 126 are disposed on two sides of the P-type gallium nitride layer 104a. In some embodiments, the source electrode 124 and the drain electrode 126 may be connected to channel layer 100, respectively. In some embodiments, the source electrode 124 and the drain electrode 126 may pass through the dielectric layer 122, the dielectric layer 118, the passivation layer 116, the barrier layer 114, and the barrier layer 102, respectively, to be connected to channel layer 100. In addition, a portion of the source electrode 124 and a portion of the drain electrode 126 may be disposed on the dielectric layer 122. The material of the source electrode 124 and the drain electrode 126 is, for example, titanium, titanium nitride, aluminum copper alloy, or a combination thereof.

Based on the above embodiments, in the HEMT device 10 and the manufacturing method thereof, the thickness T1 of the barrier layer 102 located directly under the P-type gallium nitride layer 104a is greater than the thickness T2 of the barrier layer 102 located on two sides of the P-type gallium nitride layer 104a. Therefore, the concentration of the 2DEG at the edge of the P-type gallium nitride layer 104a can be reduced, thereby reducing the leakage current of the HEMT device 10 and improving the reliability of the HEMT device 10.

In summary, in the HEMT device and the manufacturing method thereof of the aforementioned embodiments, since the thickness of the barrier layer located directly under the P-type gallium nitride layer is greater than the thickness of the barrier layer located on two sides of the P-type gallium nitride layer, the leakage current of the HEMT device can be reduced, and the reliability of the HEMT device can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A high electron mobility transistor (HEMT) device, comprising:
    a channel layer;
    a first barrier layer disposed on the channel layer;
    a P-type gallium nitride layer disposed on the first barrier layer;
    a second barrier layer disposed on the first barrier layer, wherein the second barrier layer and the P-type gallium nitride layer are separated from each other;
    a spacer disposed on a sidewall of the P-type gallium nitride layer and on the first barrier layer and located between the second barrier layer and the P-type gallium nitride layer; and
    a passivation layer disposed on the P-type gallium nitride layer, the spacer, and the second barrier layer, wherein
    a first thickness of the first barrier layer located directly under the P-type gallium nitride layer is greater than a second thickness of the first barrier layer located on two sides of the P-type gallium nitride layer, and
    the passivation layer is in direct contact with the P-type gallium nitride layer and the second barrier layer.

2. The HEMT device according to claim 1, wherein the first thickness is 14 nm to 24 nm.

3. The HEMT device according to claim 2, wherein the second thickness is 2 nm to 22 nm.

4. The HEMT device according to claim 1, wherein a first upper surface of the first barrier layer located directly under the P-type gallium nitride layer is higher than a second upper surface of the first barrier layer located on two sides of the P-type gallium nitride layer.

5. The HEMT device according to claim 1, wherein a material of the first barrier layer comprises aluminum gallium nitride.

6. The HEMT device according to claim 5, wherein an aluminum content in the aluminum gallium nitride is 5 atomic % to 50 atomic %.

7. The HEMT device according to claim 1, wherein a material of the second barrier layer comprises aluminum gallium nitride.

8. The HEMT device according to claim 7, wherein an aluminum content in the aluminum gallium nitride is 5 atomic % to 50 atomic %.

9. The HEMT device according to claim 1, wherein a width of the spacer is 0.1 µm to 0.5 µm.

10. The HEMT device according to claim 1, further comprising:
   a work function layer disposed on the P-type gallium nitride layer.

11. The HEMT device according to claim 10, wherein a width of the work function layer is smaller than a width of the P-type gallium nitride layer.

12. A manufacturing method of a HEMT device, comprising:
   providing a channel layer;
   forming a first barrier layer on the channel layer;
   forming a P-type gallium nitride layer on the first barrier layer;
   forming a second barrier layer on the first barrier layer, wherein the second barrier layer and the P-type gallium nitride layer are separated from each other;
   forming a spacer on a sidewall of the P-type gallium nitride layer and on the first barrier layer, wherein the spacer is located between the second barrier layer and the P-type gallium nitride layer; and
   forming a passivation layer on the P-type gallium nitride layer, the spacer, and the second barrier layer, wherein
   a first thickness of the first barrier layer located directly under the P-type gallium nitride layer is greater than a second thickness of the first barrier layer located on two sides of the P-type gallium nitride layer, and
   the passivation layer is in direct contact with the P-type gallium nitride layer and the second barrier layer.

13. The manufacturing method of the HEMT device according to claim 12, further comprising:
   forming a work function layer on the P-type gallium nitride layer.

14. The manufacturing method of the HEMT device according to claim 13, further comprising:
   performing a lateral etching process on the work function layer to reduce a width of the work function layer.

* * * * *